(12) United States Patent
Yoshikawa et al.

(10) Patent No.: US 7,589,583 B2
(45) Date of Patent: Sep. 15, 2009

(54) CHARGE PUMP CIRCUIT

(75) Inventors: Sadao Yoshikawa, Gifu (JP); Toshiki Rai, Gifu (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 11/939,388

(22) Filed: Nov. 13, 2007

(65) Prior Publication Data

US 2008/0116961 A1   May 22, 2008

(30) Foreign Application Priority Data

Nov. 14, 2006 (JP) ............... 2006-307461

(51) Int. Cl.
 *G05F 1/10* (2006.01)
(52) U.S. Cl. ........................ 327/536; 331/57
(58) Field of Classification Search ................ 327/535, 327/536, 537; 331/57
 See application file for complete search history.

(56) References Cited

U.S. PATENT DOCUMENTS

| | | | | |
|---|---|---|---|---|
| 5,801,934 A | * | 9/1998 | Lacey et al. | 363/60 |
| 6,525,972 B2 | * | 2/2003 | Yanagisawa | 365/189.09 |
| 6,777,991 B2 | * | 8/2004 | Murakami | 327/156 |
| 6,809,603 B1 | * | 10/2004 | Ho | 331/57 |
| 7,068,114 B2 | * | 6/2006 | Nishiyama | 331/57 |
| 7,180,794 B2 | * | 2/2007 | Matsue | 365/189.09 |
| 7,230,499 B2 | * | 6/2007 | Cang | 331/57 |
| 7,391,274 B2 | * | 6/2008 | Hsu | 331/57 |

FOREIGN PATENT DOCUMENTS

JP    2006-229755 A    8/2006

* cited by examiner

*Primary Examiner*—Jeffrey S Zweizig
(74) *Attorney, Agent, or Firm*—Morrison and Foerster LLP

(57) ABSTRACT

The invention is mainly directed to providing a charge pump circuit which realizes low power consumption. A first clock signal is supplied from an oscillator circuit to capacitor elements forming a charge pump circuit. A current generation circuit controls a current flowing through each of inverters by controlling operation of PMOS and NMOS, and as a result controls the frequency of the first clock signal. A gate and a drain of PMOS are short-circuited, and between the node thereof and a ground terminal a constant current generation circuit and a resistor are connected in parallel. The constant current generation circuit serves to keep the current flowing through the inverters constant against a change of a power supply voltage. Therefore, the frequency of the clock signal is reduced according to the increase of the power supply voltage.

2 Claims, 5 Drawing Sheets

CHARGE PUMP CIRCUIT

CROSS-REFERENCE OF THE INVENTION

This invention claims priority from Japanese Patent Application No. 2006-307461, the content of which is incorporated herein by reference in its entirety.

BACKGROUND OF THE INVENTION

1. Field of the Invention

The invention relates to a charge pump circuit for generating a high voltage from a low voltage.

2. Description of the Related Art

In a nonvolatile semiconductor memory device such as EEPROM (Electrically Programmable Read Only Memory), for example, it is necessary to supply a high positive voltage (or a high negative voltage) higher than a power supply voltage to a memory cell. When a high voltage is necessary like this, a method of integrating a charge pump circuit in the device is generally employed.

FIG. 6 is a circuit diagram of a conventional charge pump circuit. This charge pump circuit boosts an input voltage Vin (=a power supply voltage VCC) inputted to an input terminal IN, and outputs a high voltage HV as an output voltage Vout from an output terminal OUT. N-channel type charge transfer MOS transistors $T_0$ to $T_M$ (M is an arbitrary number) each having a gate and a drain short-circuited are connected in serial between the input terminal IN and the output terminal OUT. The connecting nodes of the charge transfer MOS transistors $T_0$ to $T_M$ are referred to as nodes A to X, respectively.

One terminals of capacitor elements $C_1$ to $C_M$ are connected to the nodes A to X, respectively. The other terminals of the capacitor elements $C_1$ to $C_M$ are connected to an oscillator circuit (not shown), and a first clock signal CLK and a second clock signal *CLK (a signal in opposite phase to the first clock signal CLK) with constant frequencies are alternately supplied thereto. The second clock signal *CLK is a signal formed by inverting the first clock signal CLK at an inverter 100.

In the above structure, when the power supply voltage VCC is supplied to the input terminal IN and the first and second clock signals CLK and *CLK are supplied to the capacitor elements $C_1$ to $C_M$, the high voltage HV higher than the power supply voltage VCC is obtained as the output voltage Vout from the source (the output terminal OUT) of the MOS transistor $T_M$ in the last stage. When the number of stages of the charge pump circuit is supposed to be M, HV=(M+1)×VCC is established. However, the voltage loss of the charge transfer device MOS transistors $T_0$ to $T_M$ is neglected.

The relevant technique is described in the Japanese Patent Application Publication No. 2006-229755, for example.

The output current Iout of the charge pump circuit having the above structure is expressed by an equation Iout=CfV. Here, C stands for the capacitance value of the capacitor elements $C_1$ to $C_M$, f stands for the frequency of the first clock signal CLK, and V stands for the power supply voltage VCC inputted to the input terminal IN. It is noted that all the capacitor elements $C_1$ to $C_M$ have the same capacitance values. As seen from this equation, the output current Iout of the conventional charge pump circuit is proportional to the power supply voltage VCC. Therefore, when the power supply voltage VCC is sufficiently high, the output current Iout is outputted more than needs, resulting in a problem that power consumption increases in vain.

SUMMARY OF THE INVENTION

The invention is mainly directed to providing a charge pump circuit which enables a control of an output current Iout and realizes low power consumption.

The invention is made for solving the above problem, and the main features are as follows. The invention provides a charge pump circuit including: a plurality of charge transfer devices connected in serial between an input terminal and an output terminal; capacitor elements with one terminals being connected to connecting nodes of the plurality of charge transfer devices respectively; and an oscillator circuit connected to other terminals of the capacitor elements and supplying a clock signal to the capacitor elements, wherein the oscillator circuit comprises a ring oscillator circuit having a plurality of inverters and outputting the clock signal; and a current generation circuit controlling a current flowing through the inverters so as to reduce a frequency of the clock signal according to an increase of a power supply voltage.

The invention also provides a charge pump circuit including: a plurality of charge transfer devices connected in serial between an input terminal and an output terminal; capacitor elements with one terminals being connected to connecting nodes of the plurality of charge transfer devices respectively; an oscillator circuit connected to other terminals of the capacitor elements and supplying a clock signal with a constant frequency to the capacitor elements; and a constant current generation circuit connected in serial between the input terminal and the charge transfer devices and supplying a constant current to the charge transfer devices.

DETAILED DESCRIPTION OF THE INVENTION

A first embodiment of the invention will be described referring to figures. The same numerals are given to the same components as the conventional ones, and the description thereof will be simplified or omitted.

Figure 1:
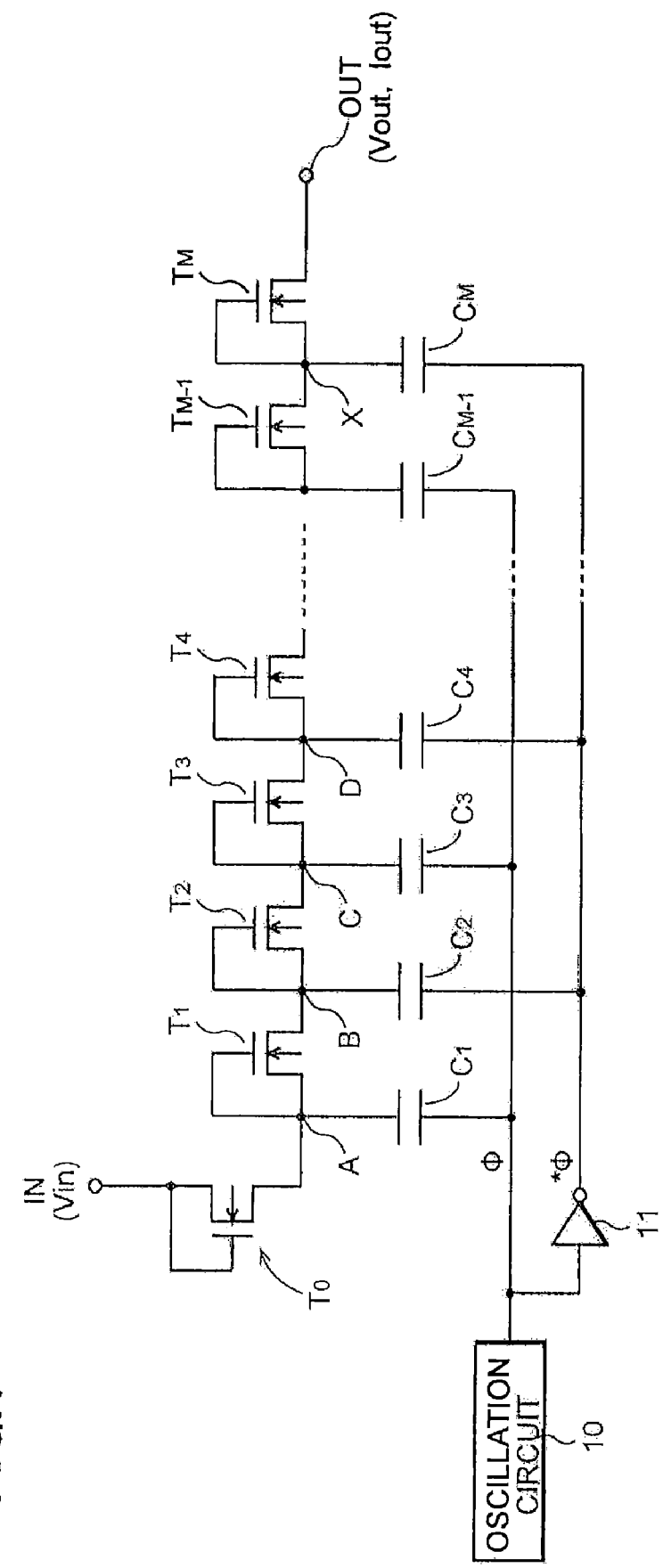
FIG. 1 is a circuit diagram for explaining a charge pump circuit of a first embodiment of the invention.

FIG. 1 is a circuit diagram of a charge pump circuit of the first embodiment. N-channel type charge transfer MOS transistors $T_0$ to $T_M$ (M is an arbitrary number) are connected in serial between an input terminal IN and an output terminal OUT. The connecting nodes of the charge transfer MOS transistors $T_0$ to $T_M$ are referred to as nodes A to X, respectively.

One terminals of capacitor elements $C_1$ to $C_M$ are connected to the nodes A to X, respectively. The other terminals of the capacitor elements $C_1$ to $C_M$ are connected to an oscillator circuit 10. A first clock signal $\Phi$ and a second clock signal *$\Phi$ (a signal in opposite phase to the first clock signal $\Phi$) are alternately supplied to the capacitor elements $C_1$ to $C_M$. More specifically, the first clock signal $\Phi$ is supplied to the capacitor elements $C_1$, $C_3$ ... and $C_{M-1}$, and the second clock signal *Φ is supplied to the capacitor elements C$_2$, C$_4$ . . . . and C$_M$. The second clock signal *Φ is a signal formed by inverting the first clock signal Φ at an inverter 11.

The first and second clock signals Φ and *Φ of this embodiment have characteristics that those frequencies f$_\Phi$ are reduced according to an increase of a power supply voltage. This will be described below.

In the above structure, when a power supply voltage VCC is supplied to the input terminal IN and the first and second clock signals Φ and *Φ are supplied to the capacitor elements C$_1$ to C$_M$, a high voltage HV higher than the power supply voltage VCC is obtained as an output voltage Vout from the source (the output terminal OUT) of the MOS transistor T$_M$ in the last stage.

Figure 2:
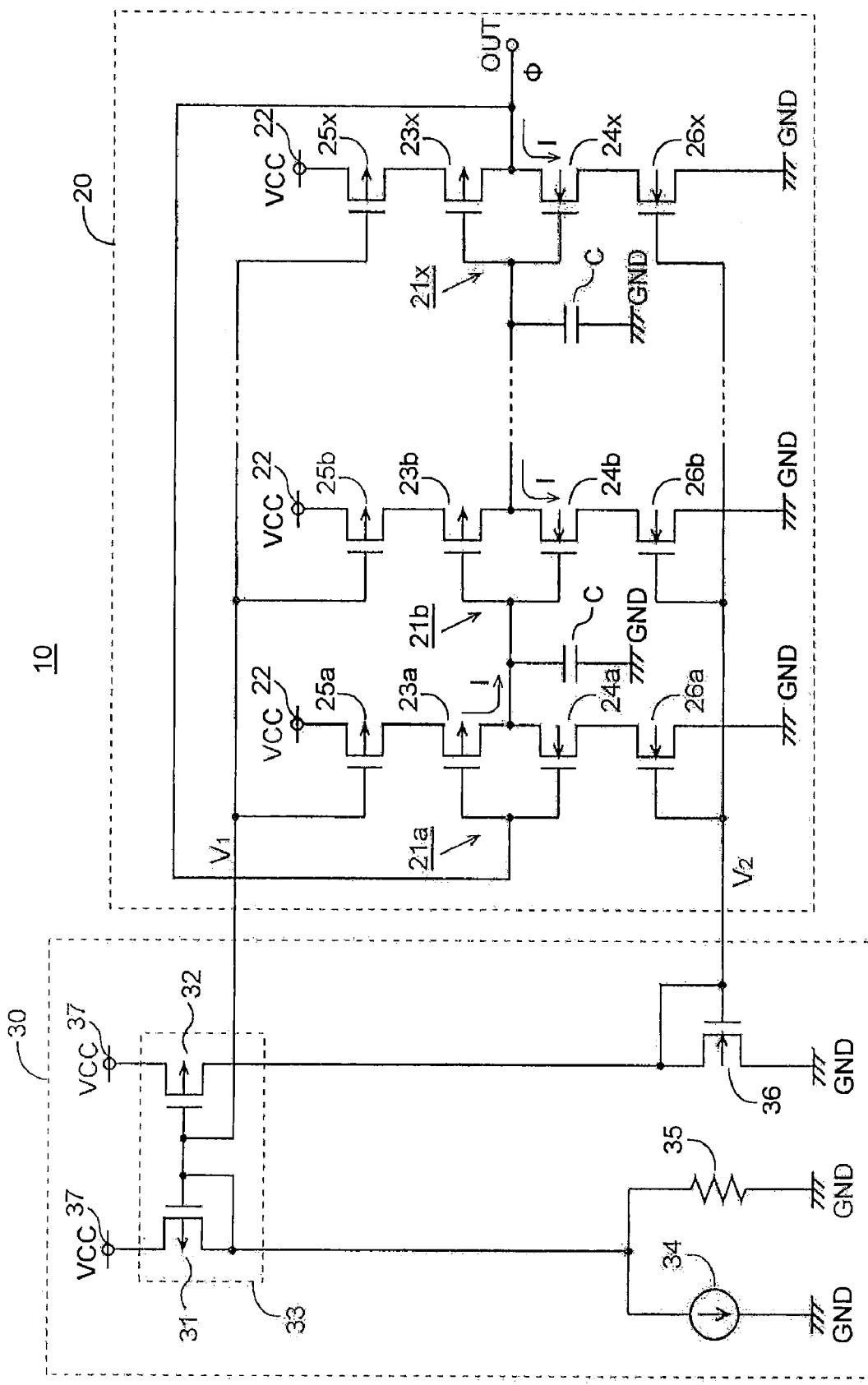
FIG. 2 is a circuit diagram for explaining an oscillator circuit of the first embodiment of the invention.

Next, the structure of the oscillator circuit 10 will be described. FIG. 2 is a circuit diagram showing an example of the structure of the oscillator circuit 10 of the first embodiment. The oscillator circuit 10 includes a ring oscillator circuit 20 and a current generation circuit 30.

The ring oscillator circuit 20 of the embodiment will be described first. The ring oscillator circuit 20 has odd and three or more stages of inverters 21*a* to 21*x* connected in serial into a ring shape. The output terminal of the final stage inverter 21*x* is connected to the input terminal of the first stage inverter 21*a*. The output terminal Out of the inverter 21*x* is the output terminal of this oscillator circuit 10, and the first clock signal Φ is outputted from this output terminal Out.

The inverters 21*a* to 21*x* are so-called CMOS inverters configured of P-channel type MOS transistors (hereafter, referred to as PMOS) 23*a* to 23*x* and N-channel type MOS transistors (hereafter, referred to as NMOS) 24*a* to 24*x*, being formed between a power supply terminal 22 and a ground terminal GND. The power supply terminal 22 is a terminal supplying the power supply voltage VCC, and the ground terminal GND is a terminal supplying a ground voltage.

One terminals of capacitor elements C are connected to the nodes of the inverters 21*a* to 21*x*, respectively. The other terminals of the capacitor elements C are connected to the ground terminal GND.

PMOS 25*a* to 25*x* which respectively control a current I flowing from the power supply terminal 22 through the inverters 21*a* to 21*x* through the current generation circuit 30 described below are connected between the drains of the PMOS 23*a* to 23*x* and the power supply terminal 22, respectively. Furthermore, NMOS 26*a* to 26*x* which respectively control a current I flowing from the inverters 21*a* to 21*x* to the ground terminal GND are connected between the drains of the NMOS 24*a* to 24*x* and the ground terminal GND.

Next, the current generation circuit 30 of the embodiment will be described. The current generation circuit 30 controls a current I flowing through the inverters 21*a* to 21*x* by controlling the operation of the PMOS 25*a* to 25*x* and the NMOS 26*a* to 26*x*, and as a result controls the frequency of the first clock signal Φ described above.

The current generation circuit 30 has a current mirror circuit 33 configured of PMOS 31 and 32, a constant current generation circuit 34, a resistor 35, and an NMOS 36.

The sources of the PMOS 31 and 32 are connected to a power supply terminal 37. The gate and drain of the PMOS 31 are short-circuited, and between the node thereof and the ground terminal GND the constant current generation circuit 34 and the resistor 35 are connected in parallel. The constant current generation circuit 34 is a circuit which keeps an output current almost constant against an applied voltage, and configured of, for example, a current mirror circuit having a pair of MOS transistors.

The resistor 35 is to adjust an inversely proportional relation of the frequency f$_\Phi$ of the first clock signal Φ to an increase of the power supply voltage VCC. It is preferable that the frequency f$_\Phi$ is inversely proportional to an increase of the power supply voltage VCC from the view point of keeping the output current Iout constant and reducing the power consumption of the charge pump circuit.

The gate of the PMOS 31 is connected to the gate of the PMOS 32, forming the current mirror circuit 33. The voltage level of the node of the PMOS 31 and the PMOS 32 is supplied to each of the gates of the PMOS 25*a* to 25*x* as a first bias voltage V$_1$. It means that the PMOS 31 and each of the PMOS 25*a* to 25*x* form a current mirror circuit.

Furthermore, the NMOS 36 with its gate and drain being short-circuited is serially connected between the drain of the PMOS 32 and the ground terminal GND. The voltage level of the node of the PMOS 32 and the NMOS 36 is supplied to each of the gates of the NMOS 26*a* to 26*x* as a second bias voltage V$_2$. It means that the NMOS 36 and each of the NMOS 26*a* to 26*x* form a current mirror circuit.

Next, the operation of the oscillator circuit 10 will be described. When the power supply voltage VCC is over the operation voltage of the oscillator circuit 10, the current I flows in each of the inverters 21*a* to 21*x* as shown in FIG. 2. When the power supply voltage VCC increases, the current value of the current I is kept almost constant by the effect of the constant current generation circuit 34 although the current value is increased a little by the resistor 35. On the other hand, the threshold of each of the inverters 21*a* to 21*x* is not kept constant but proportional to the power supply voltage VCC.

Figure 3:
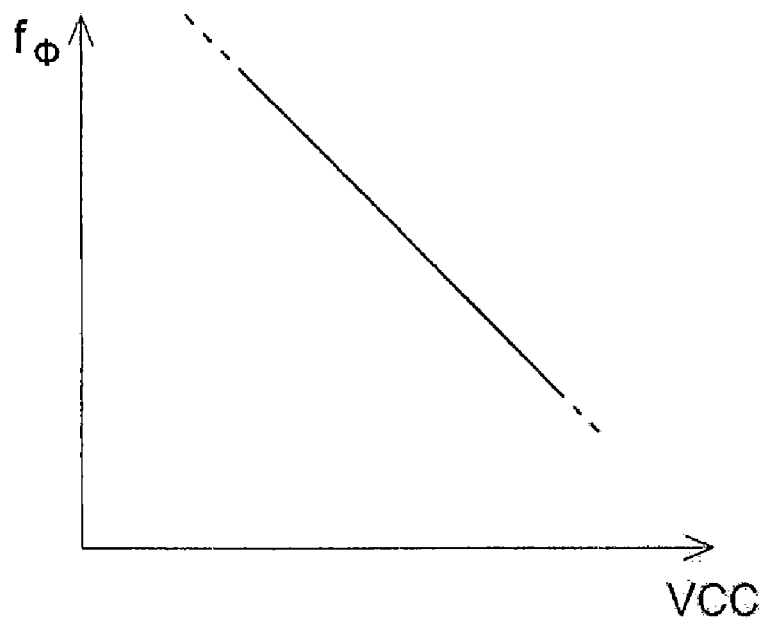
FIG. 3 is a graph for explaining the operation of the oscillator circuit of the first embodiment of the invention.

Therefore, the delay time (gate delay) of each of the inverters 21*a* to 21*x* is increased according to the increase of the power supply voltage VCC, and it means that the frequency f$_\Phi$ of the first clock signal Φ outputted by the ring oscillator circuit 20 is reduced according to the increase of the power supply voltage VCC as shown in FIG. 3. It is noted that the inclination of a VCC-f$_\Phi$ curve shown in FIG. 3 (the increase amount of the frequency f$_\Phi$ relative to the increase amount of VCC) is freely adjustable by the circuit structure of the constant current generation circuit 34 and the resistance value of the resistor R.

Figure 4:
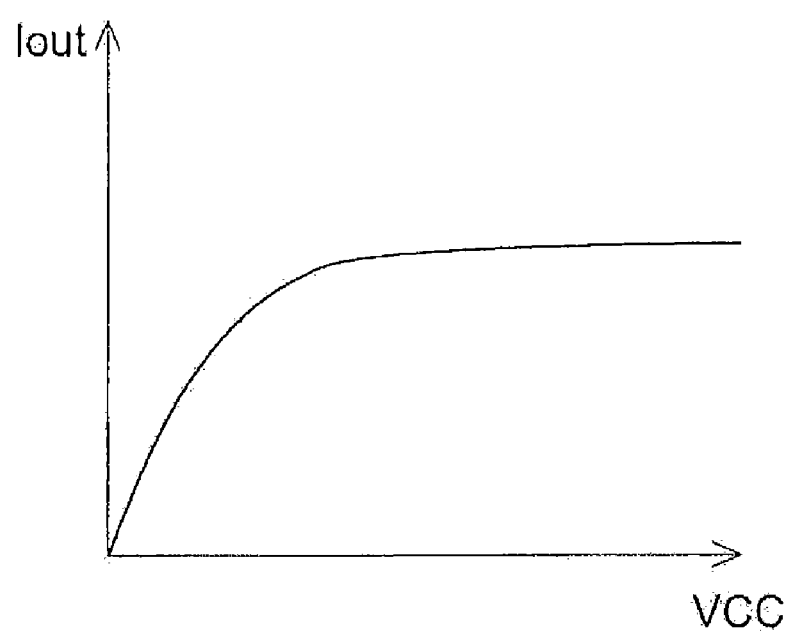
FIG. 4 is a graph for explaining the operation of the charge pump circuit of the first embodiment of the invention.

Then, since the frequency f$_\Phi$ of the first clock signal Φ is reduced according to the increase of the power supply voltage VCC, the output current Iout draws a saturation curve relative to the power supply voltage VCC as shown in FIG. 4. Even when the saturation curve is not perfect, the structure of this embodiment reduces the increasing rate of the output current Iout relative to the power supply voltage VCC, compared with the conventional structure. The relation that the increase of the output current Iout is reduced by the reduction of the frequency f$_\Phi$ of the clock signal Φ according to the increase of the power supply voltage VCC is expressed from the above mentioned equation Iout=Cf$_\Phi$V. C stands for the capacitance of each of the capacitor elements C$_1$ to C$_M$, and V stands for the power supply voltage VCC inputted to the input terminal In.

Accordingly, since the charge pump circuit of the embodiment has the oscillator circuit 10 which reduces the frequency f$_\Phi$ of the clock signal Φ according to the increase of the power supply voltage VCC, the increase of the output current Iout is reduced compared with the conventional structure. In other words, it moderates the rate of change of the output current Iout relative to the change of the power supply voltage VCC, compared with the conventional structure. This realizes the effective operation of the charge pump circuit.

Figure 5:
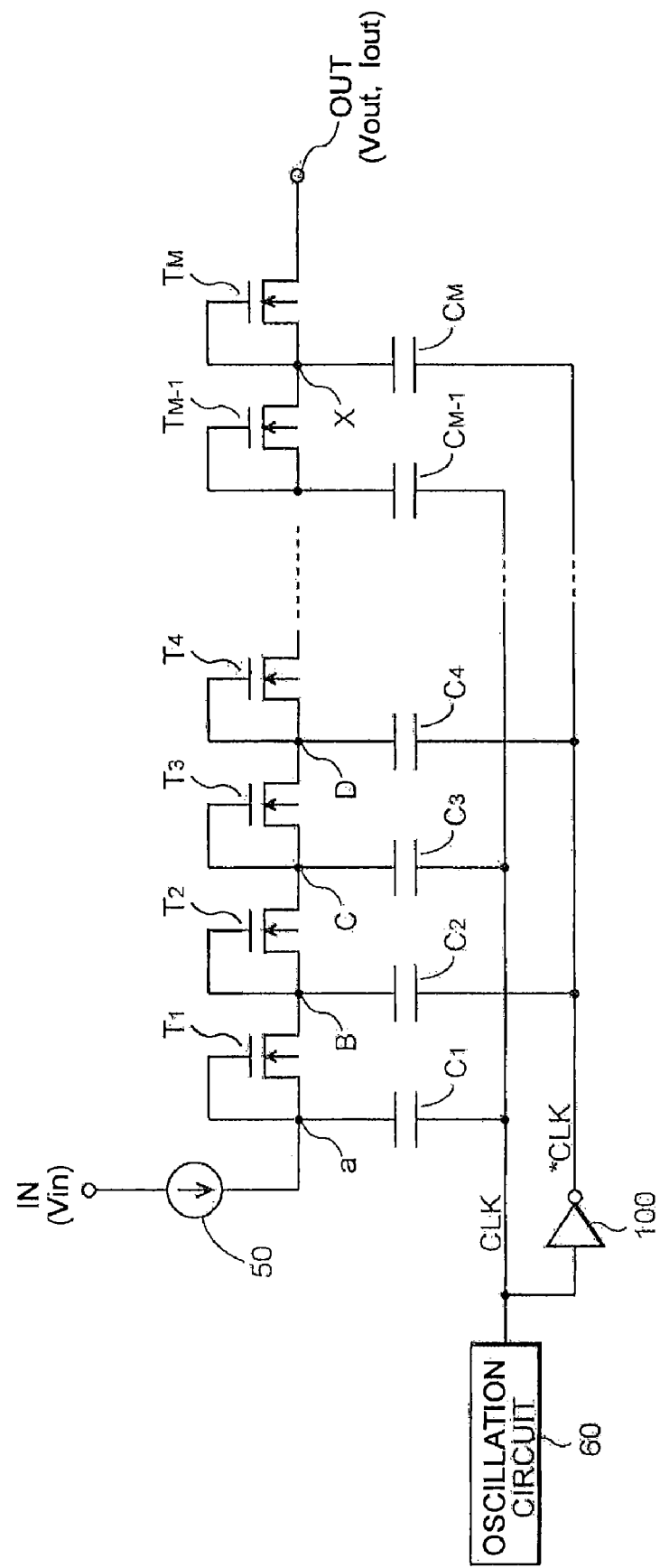
FIG. 5 is a circuit diagram for explaining a charge pump circuit of a second embodiment of the invention.
Figure 6:
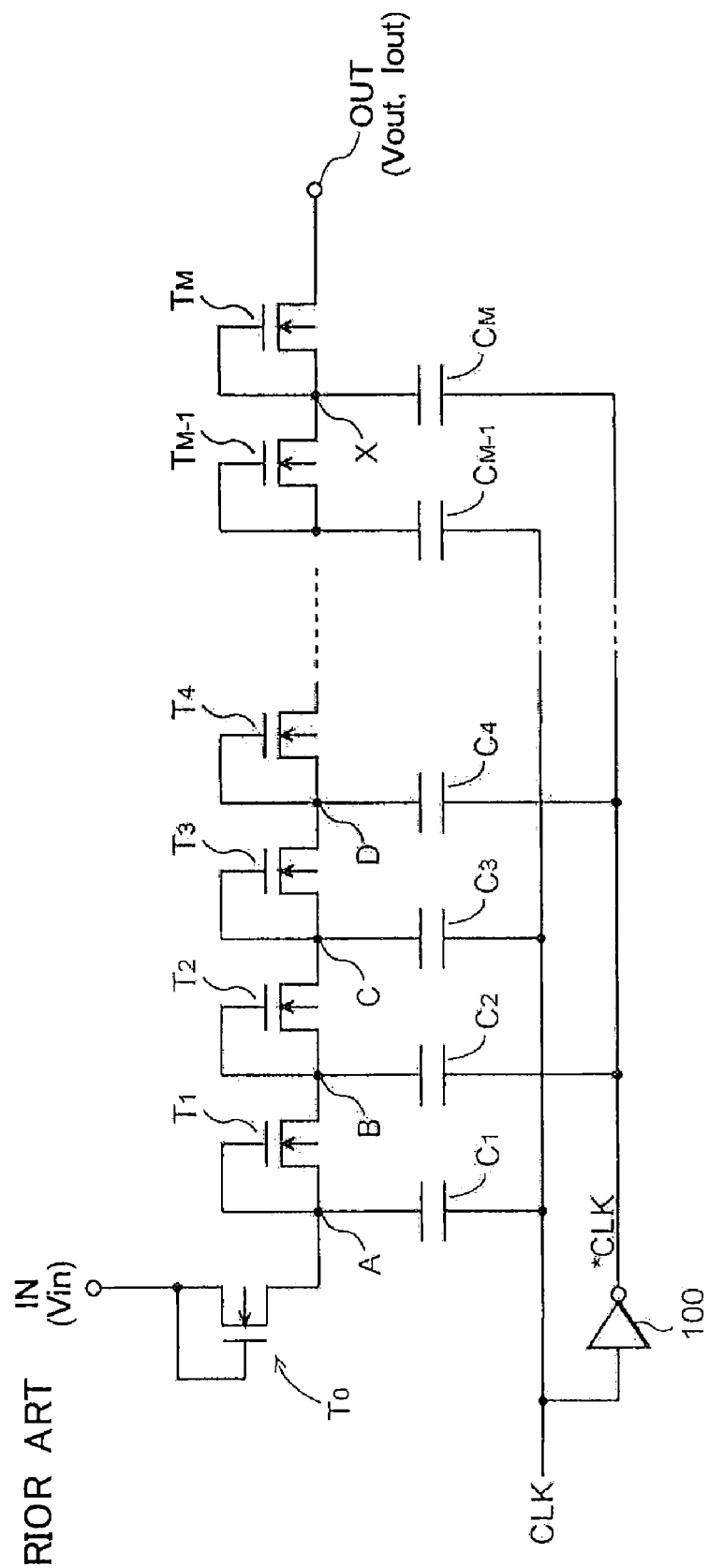
FIG. 6 is a circuit diagram for explaining a conventional charge pump circuit.

Next, a second embodiment of the invention will be described. FIG. 5 is a circuit diagram of a charge pump circuit of the second embodiment. The same numerals are given to the same components as those of the first embodiment of the invention or the conventional ones, and the description thereof will be simplified or omitted.

A constant current generation circuit 50 is serially connected between the input terminal IN and the charge transfer MOS transistor $T_1$ in the first stage so as to supply a constant current to the charge transfer MOS transistors $T_1$ to $T_M$. The constant current generation circuit 50 is a circuit which keeps an output current almost constant against an applied voltage, and configured of, for example, a current mirror circuit having a pair of MOS transistors.

The N-channel type charge transfer MOS transistors $T_1$ to $T_M$ (M is an arbitrary number) each having a gate and a drain short-circuited are serially connected between the constant current generation circuit 50 and the output terminal OUT. The connection node of the constant current generation circuit 50 and the charge transfer MOS transistor is referred to a node a. The connection nodes of the charge transfer MOS transistors $T_1$ to $T_M$ are referred to as nodes B to X, respectively.

One terminals of the capacitor elements $C_1$ to $C_M$ are connected to the node a and the nodes B to X, respectively. An oscillator circuit 60 is connected to the other terminals of the capacitor elements $C_1$ to $C_M$. A first clock signal CLK and a second clock signal *CLK (a signal in opposite phase to the first clock signal CLK) are alternately supplied to the capacitor elements $C_1$ to $C_M$. Differing from the above described first embodiment, the oscillator circuit 60 outputs a clock signal CLK with a constant frequency against a change of the power supply voltage.

In this structure, when the power supply voltage VCC is supplied to the input terminal IN and the first and second clock signals CLK and *CLK are supplied to the capacitor elements $C_1$ to $C_M$, a boosted high voltage HV is outputted as the output voltage Vout from the output terminal OUT.

In the second embodiment, the constant current generation circuit 50 is connected between the input terminal IN and the charge transfer MOS transistors $T_1$ to $T_M$. This provides a constant output current Iout independent of the amount of the power supply voltage VCC during the operation of the charge pump circuit. Furthermore, the output current Iout is surely prevented from being outputted more than needs.

Accordingly, both the described first and second embodiments reduce the increase of the output current Iout, compared with the conventional structure. It is noted that the invention is not limited to the above described embodiments and modification may be possible within the scope of the invention. The invention is widely applicable to the charge pump circuit.

The charge pump circuit of the invention has the current generation circuit which reduces the frequency of the clock signal to be supplied to the capacitor elements according to the increase of the power supply voltage. Alternatively, the charge pump circuit of the invention has the constant current generation circuit between the input terminal and the charge transfer devices. Therefore, the output current Iout is prevented from being outputted more than needs when the power supply voltage is sufficiently high, compared with the conventional structure.

What is claimed is:

1. A charge pump circuit comprising:
   a plurality of charge transfer devices connected in serial between an input terminal and an output terminal;
   a plurality of capacitor elements, a terminal of each of the capacitor elements being connected to a corresponding connecting node of the charge transfer devices; and
   an oscillator circuit connected to another terminal of said each of the capacitor elements and supplying a clock signal to the capacitor elements, the oscillator circuit comprising a ring oscillator circuit comprising a plurality of inverters and outputting the clock signal, and a current generation circuit controlling a current flowing through the inverters so as to reduce a frequency of the clock signal according to an increase of a power supply voltage,
   wherein the ring oscillator circuit comprises first transistors controlling a current flowing from a power terminal to the inverters,
   the current generation circuit comprises a second transistor forming a first current mirror circuit with the first transistors, a constant current generation circuit connected in serial with the second transistor and a resistor connected to the second transistor in parallel with the constant current generation circuit, and
   the resistor has such a resistance value that a frequency of the clock signal is inversely proportional to an increase of a power supply voltage.

2. The charge pump circuit of claim 1, wherein the ring oscillator circuit further comprises a plurality of fourth transistors controlling a current flowing from the inverters to a ground terminal, and the current generation circuit further comprises a third transistor forming a second current mirror circuit with the second transistor and a fifth transistor connected in serial with the third transistor and forming a third current mirror circuit with the fourth transistors.

* * * * *